US012641966B2

(12) United States Patent
Fukuda

(10) Patent No.: US 12,641,966 B2
(45) Date of Patent: May 26, 2026

(54) DISPLAY DEVICE AND MANUFACTURING METHOD OF THE SAME

(71) Applicant: Magnolia White Corporation, Tokyo (JP)

(72) Inventor: Kaichi Fukuda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 515 days.

(21) Appl. No.: 18/187,688

(22) Filed: Mar. 22, 2023

(65) Prior Publication Data

US 2023/0309350 A1 Sep. 28, 2023

(30) Foreign Application Priority Data

Mar. 23, 2022 (JP) ................................. 2022-047128

(51) Int. Cl.
| | |
|---|---|
| *H10K 59/126* | (2023.01) |
| *H10K 59/12* | (2023.01) |
| *H10K 59/122* | (2023.01) |
| *H10K 59/35* | (2023.01) |
| *H10K 59/80* | (2023.01) |
| G09G 3/3208 | (2016.01) |

(52) U.S. Cl.
CPC ....... *H10K 59/126* (2023.02); *H10K 59/1201* (2023.02); *H10K 59/122* (2023.02); *H10K 59/352* (2023.02); *H10K 59/873* (2023.02); *G09G 3/3208* (2013.01)

(58) Field of Classification Search
CPC ............. H10K 59/126; H10K 59/1201; H10K 59/122; H10K 59/352; H10K 59/873; H10K 59/353; G09G 3/3208
See application file for complete search history.

(56) References Cited

U.S. PATENT DOCUMENTS

| | | | |
|---|---|---|---|
| 2004/0160170 A1 | 8/2004 | Sato et al. | |
| 2009/0009069 A1 | 1/2009 | Takata | |
| 2019/0363275 A1 | 11/2019 | Ochi et al. | |
| 2020/0272052 A1* | 8/2020 | Kang | ........................ G03F 7/11 |
| 2020/0328263 A1* | 10/2020 | Choi | .................... H10K 59/122 |
| 2020/0373513 A1* | 11/2020 | Kim | ........................ H10K 59/38 |
| 2022/0077251 A1 | 3/2022 | Choung et al. | |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |
| JP | 2009-32673 A | 2/2009 |
| JP | 2010-118191 A | 5/2010 |
| WO | 2018/179308 A1 | 10/2018 |

* cited by examiner

*Primary Examiner* — Kevin Quarterman
(74) *Attorney, Agent, or Firm* — XSENSUS LLP

(57) ABSTRACT

According to one embodiment, a display device comprises a first display element including a first lower electrode, a first upper electrode, and a first organic layer, a second display element including a second lower electrode, a second upper electrode, and a second organic layer, and a partition between the first and second display elements. The partition comprises a lower portion including first and second side surfaces, and an upper portion including a first end portion protruding from the first side surface and a second end portion protruding from the second side surface. The first end portion has a light-shielding property, and the second end portion has translucency.

10 Claims, 20 Drawing Sheets

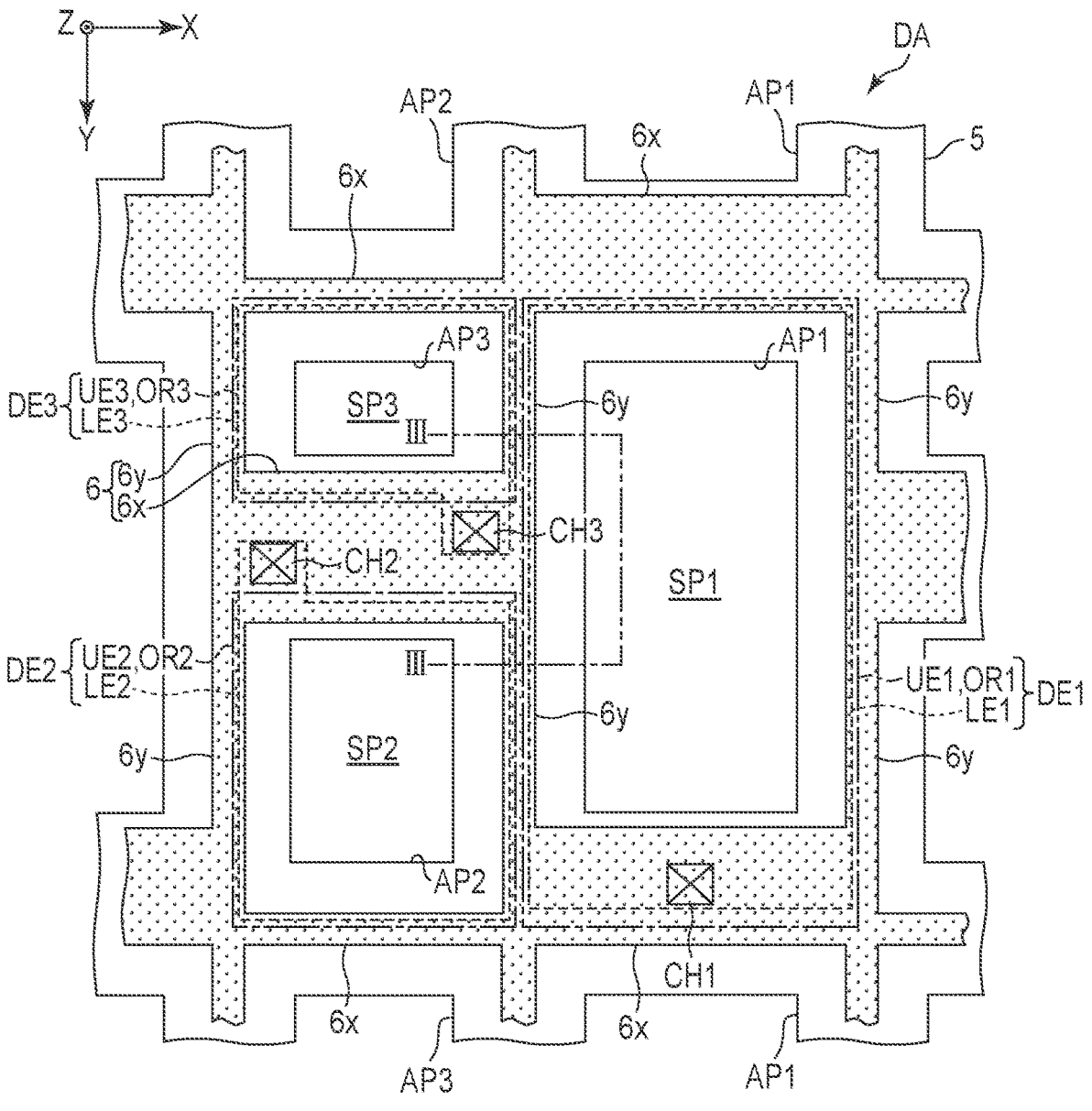
F I G. 2

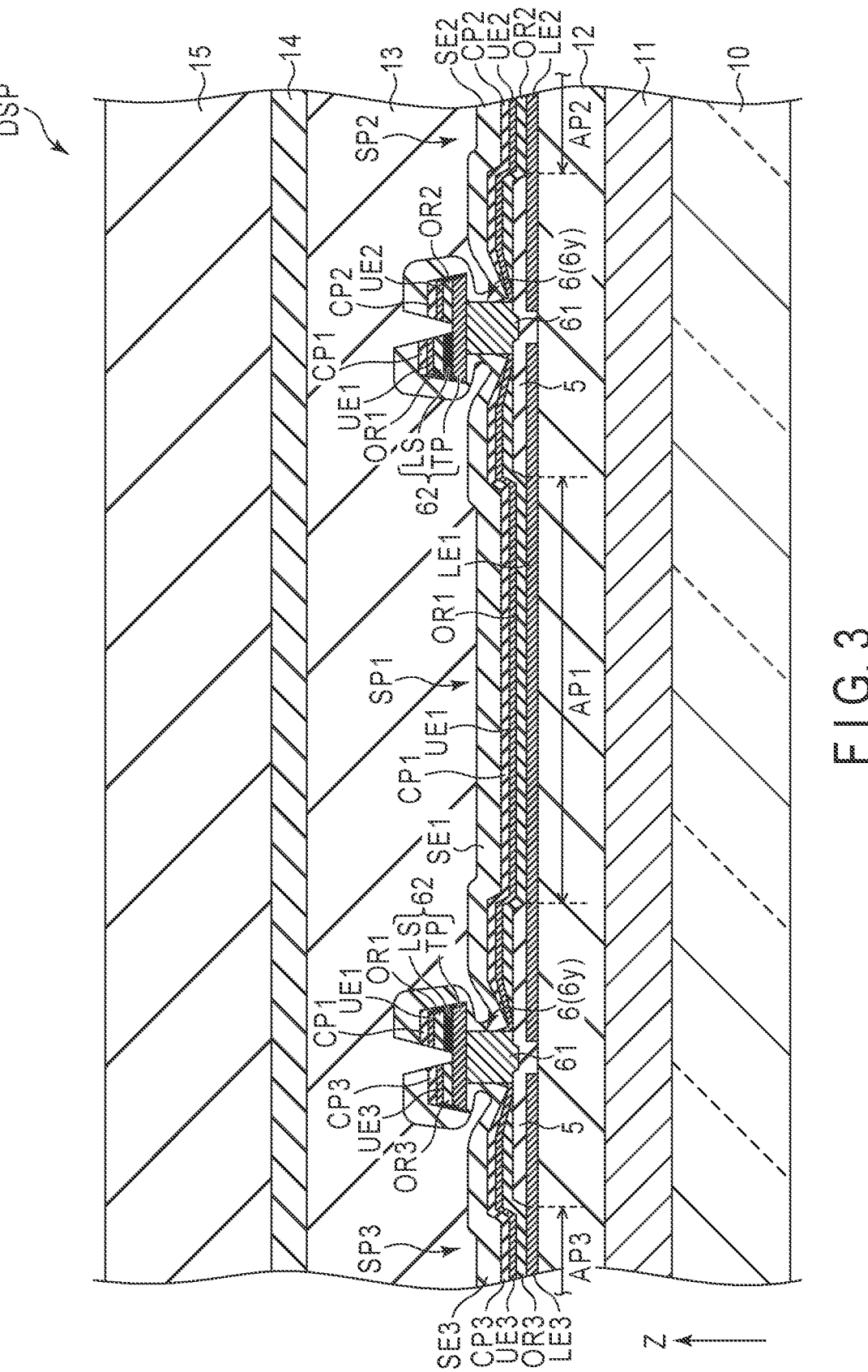
F I G. 3

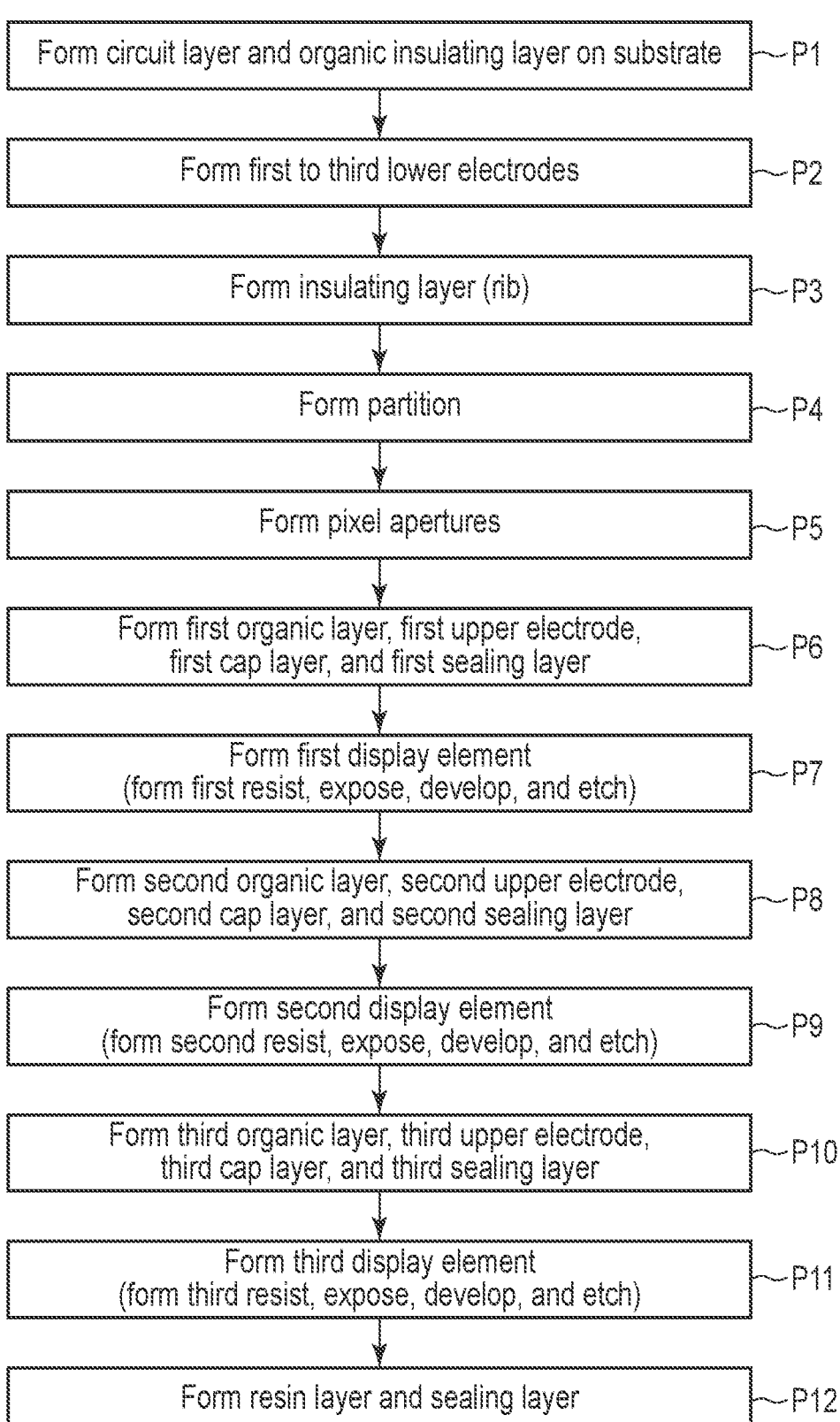

Form circuit layer and organic insulating layer on substrate — P1

Form first to third lower electrodes — P2

Form insulating layer (rib) — P3

Form partition — P4

Form pixel apertures — P5

Form first organic layer, first upper electrode, first cap layer, and first sealing layer — P6

Form first display element (form first resist, expose, develop, and etch) — P7

Form second organic layer, second upper electrode, second cap layer, and second sealing layer — P8

Form second display element (form second resist, expose, develop, and etch) — P9

Form third organic layer, third upper electrode, third cap layer, and third sealing layer — P10

Form third display element (form third resist, expose, develop, and etch) — P11

Form resin layer and sealing layer — P12

F I G. 7

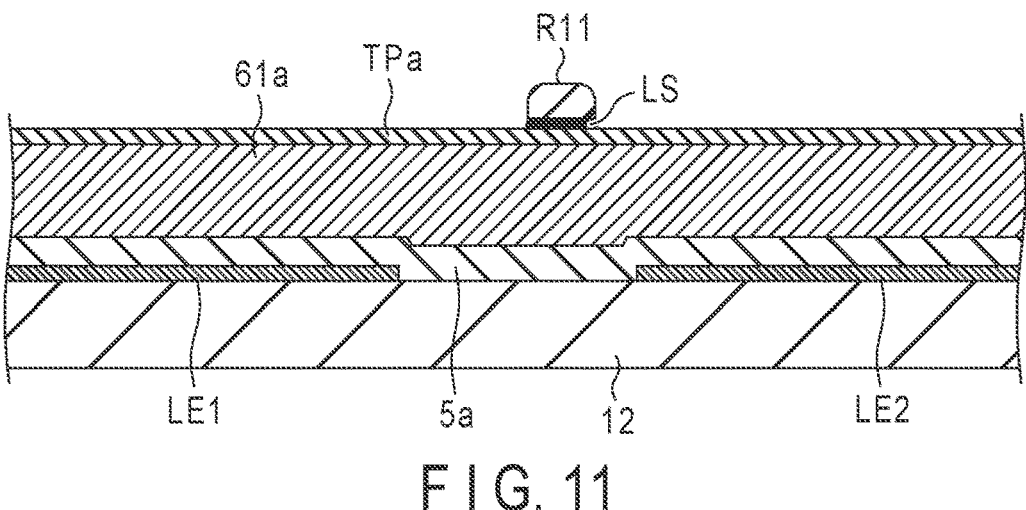
F I G. 11
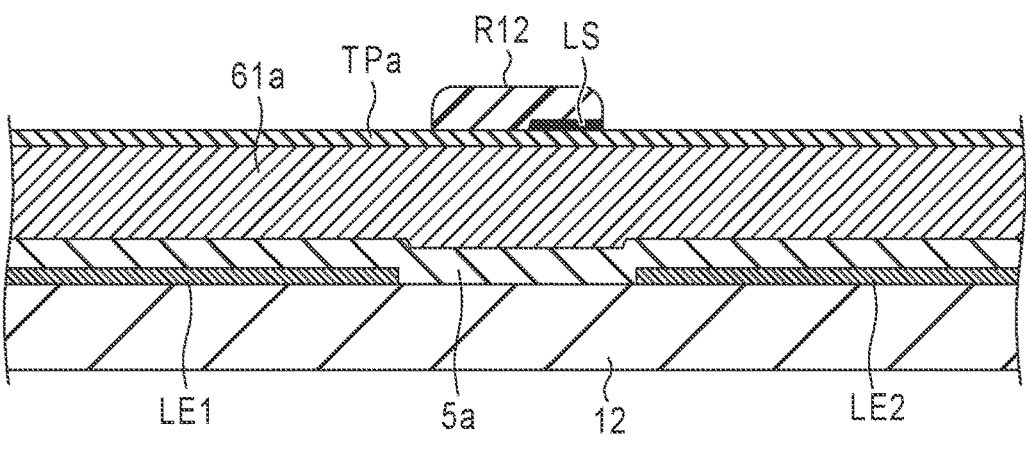
F I G. 12
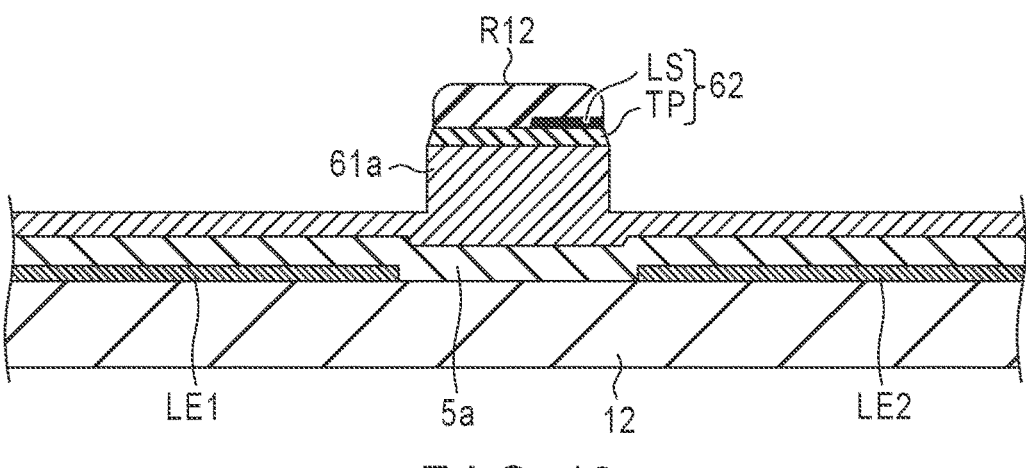
F I G. 13

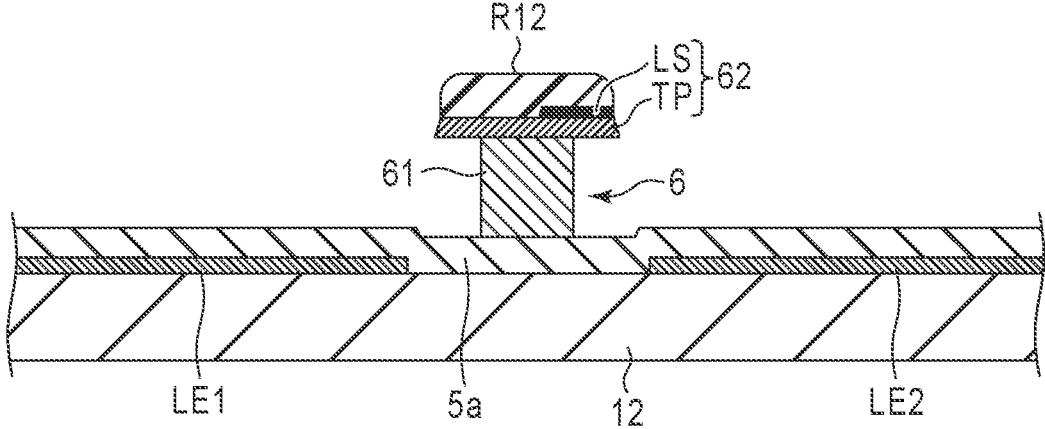
F I G. 14
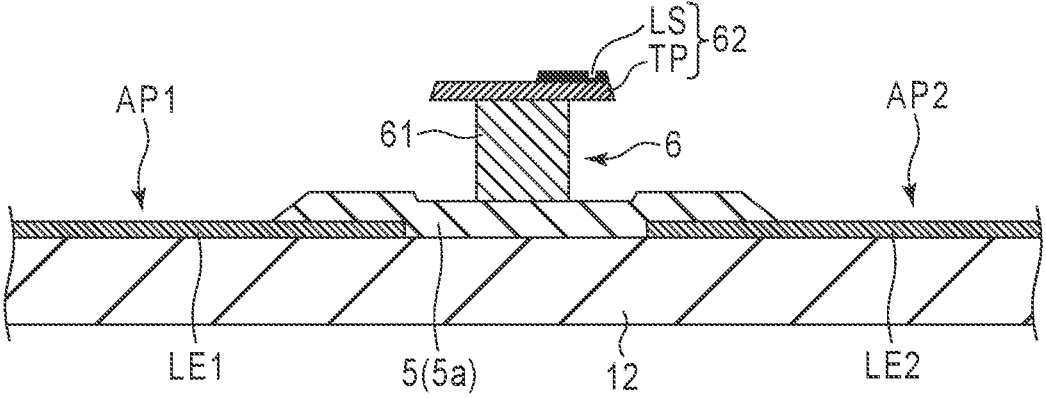
F I G. 15

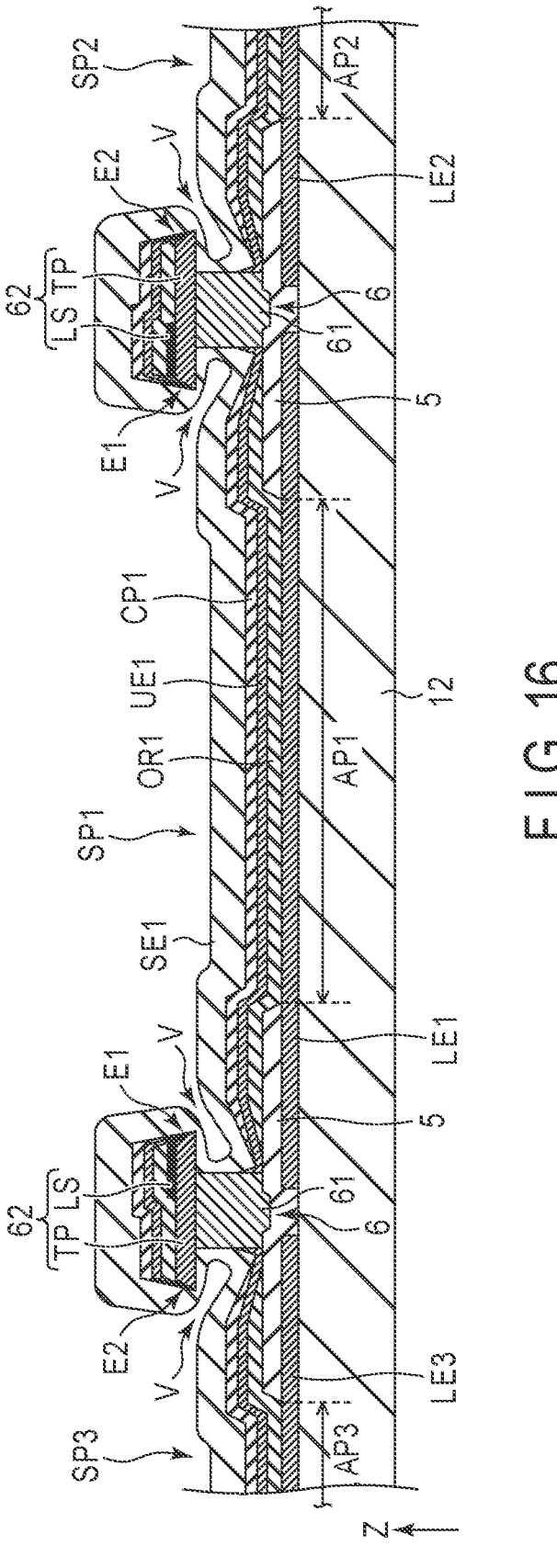
F I G. 16

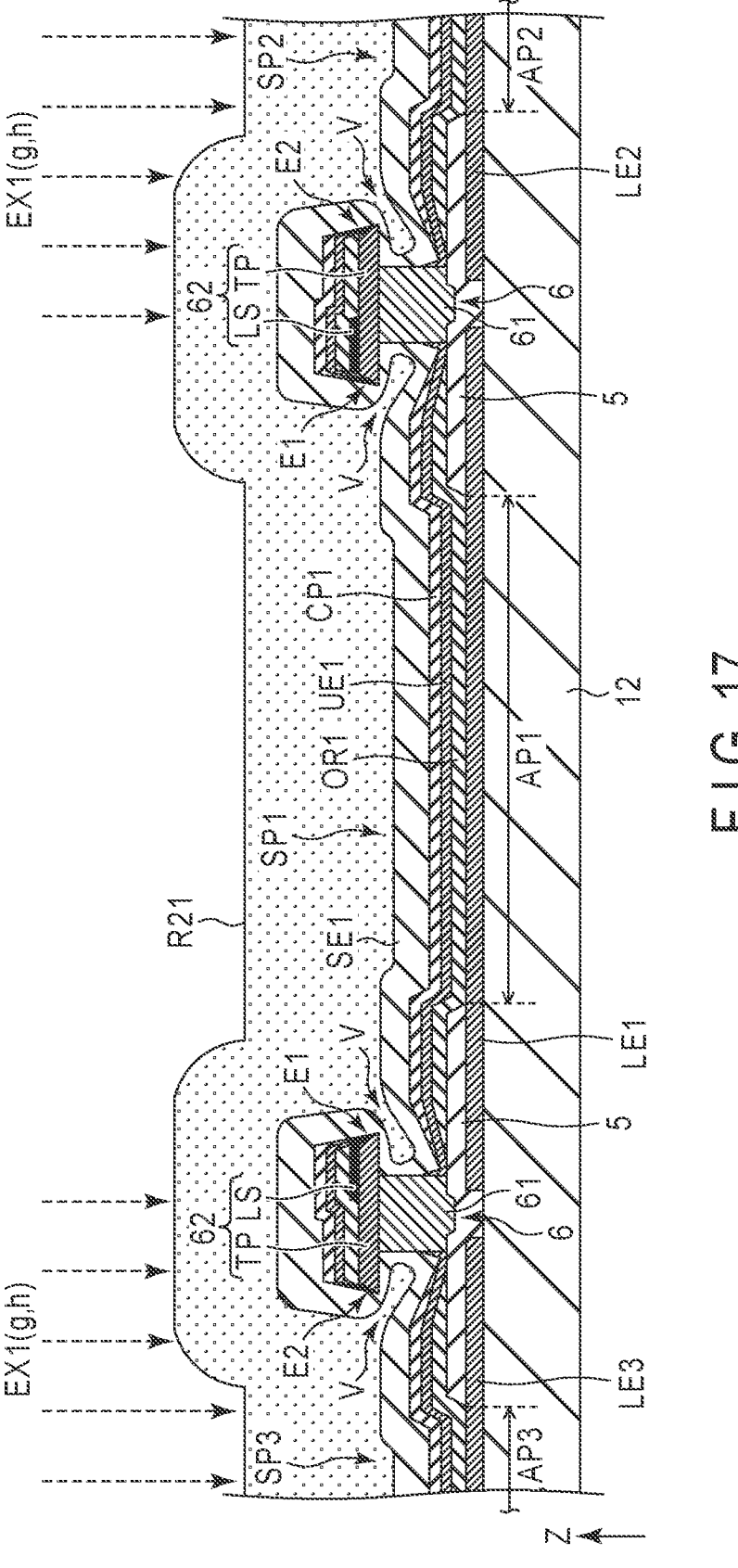
F I G. 17

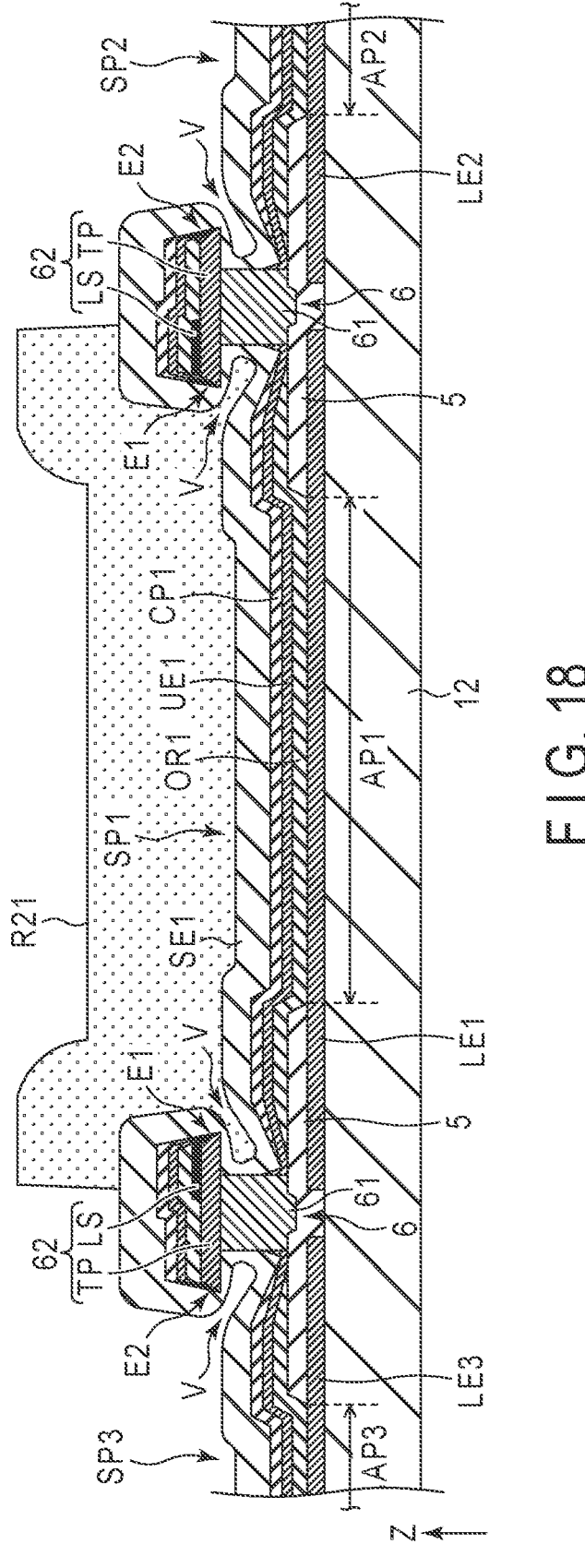
F I G. 18

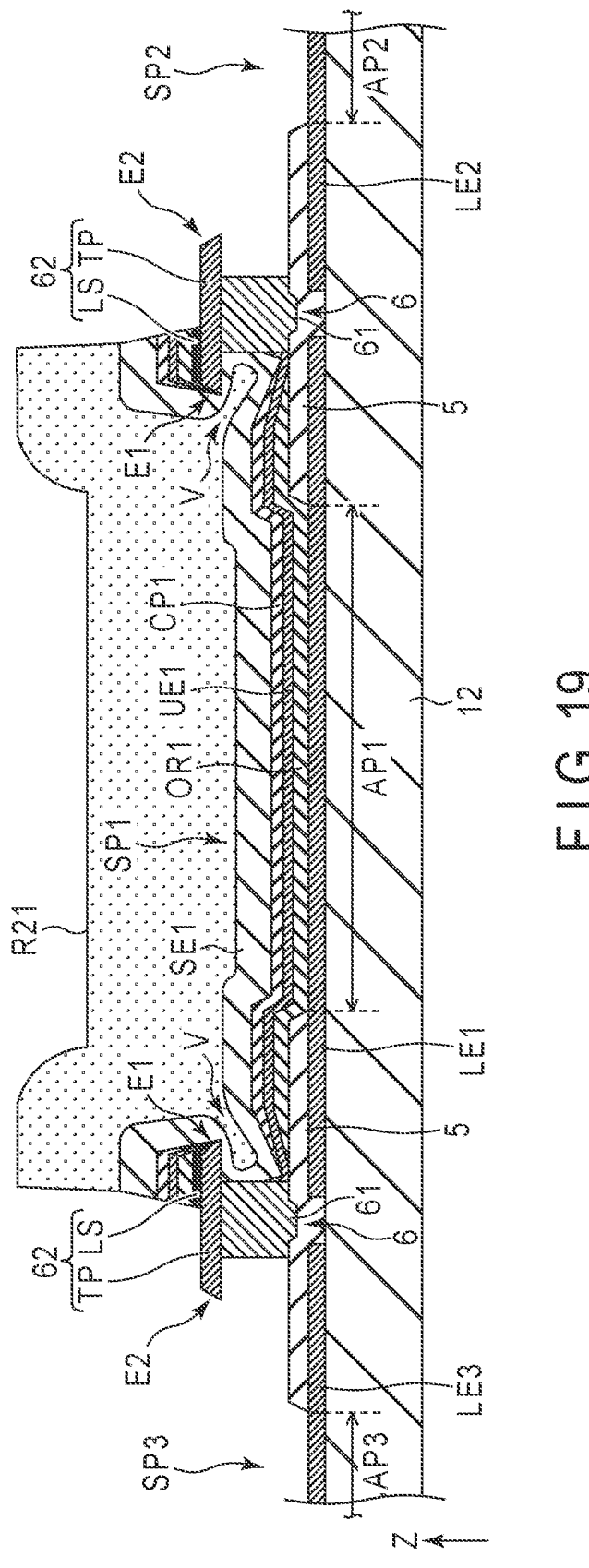
F I G. 19

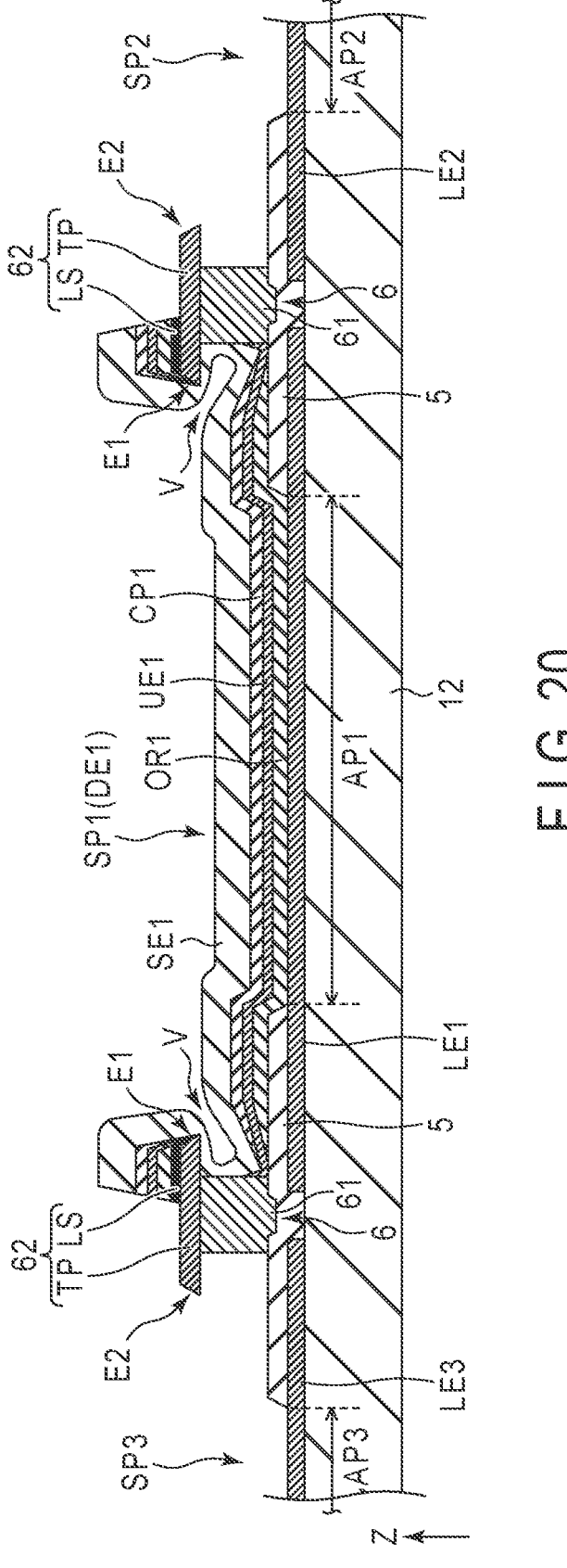
F I G. 20

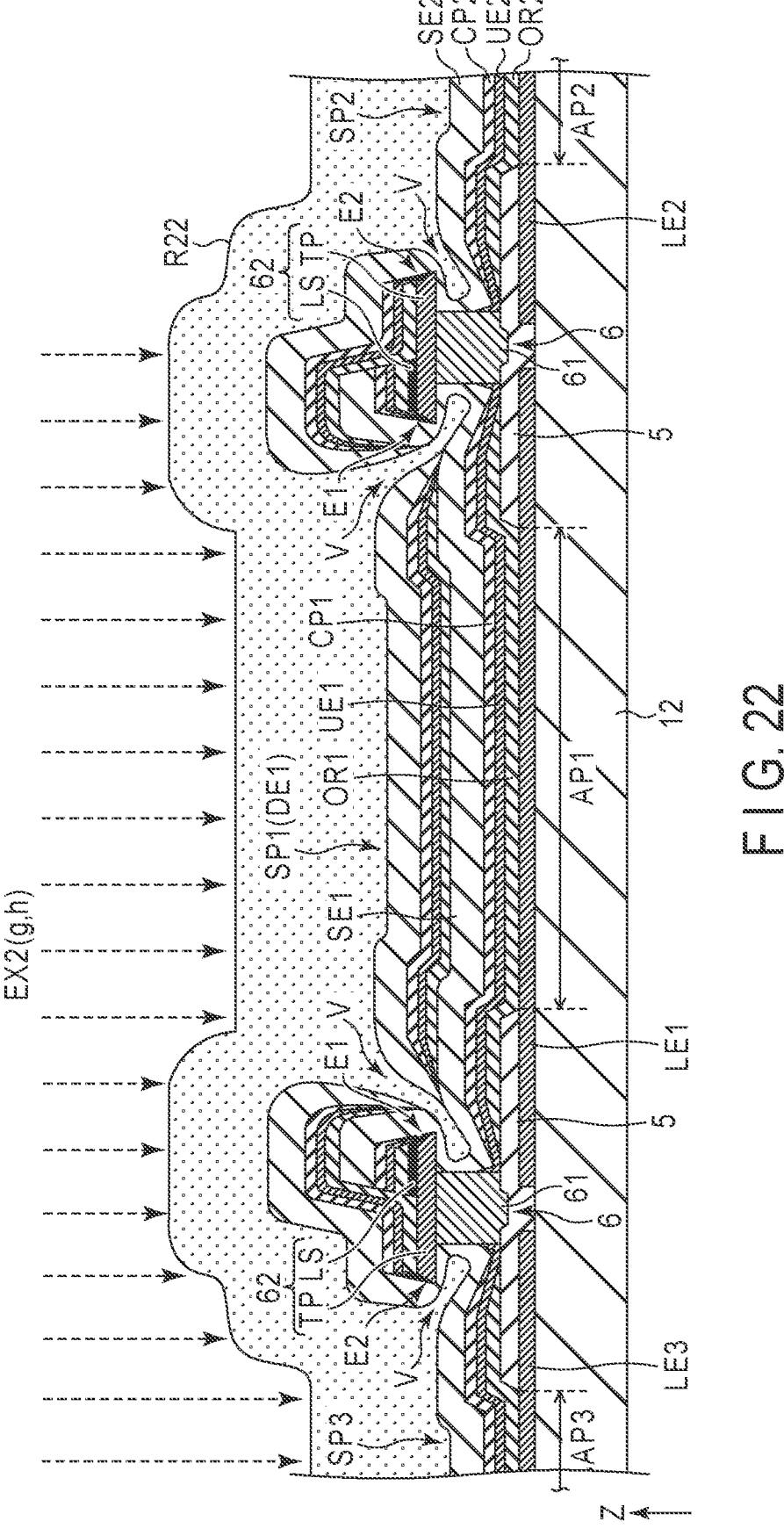
F I G. 22

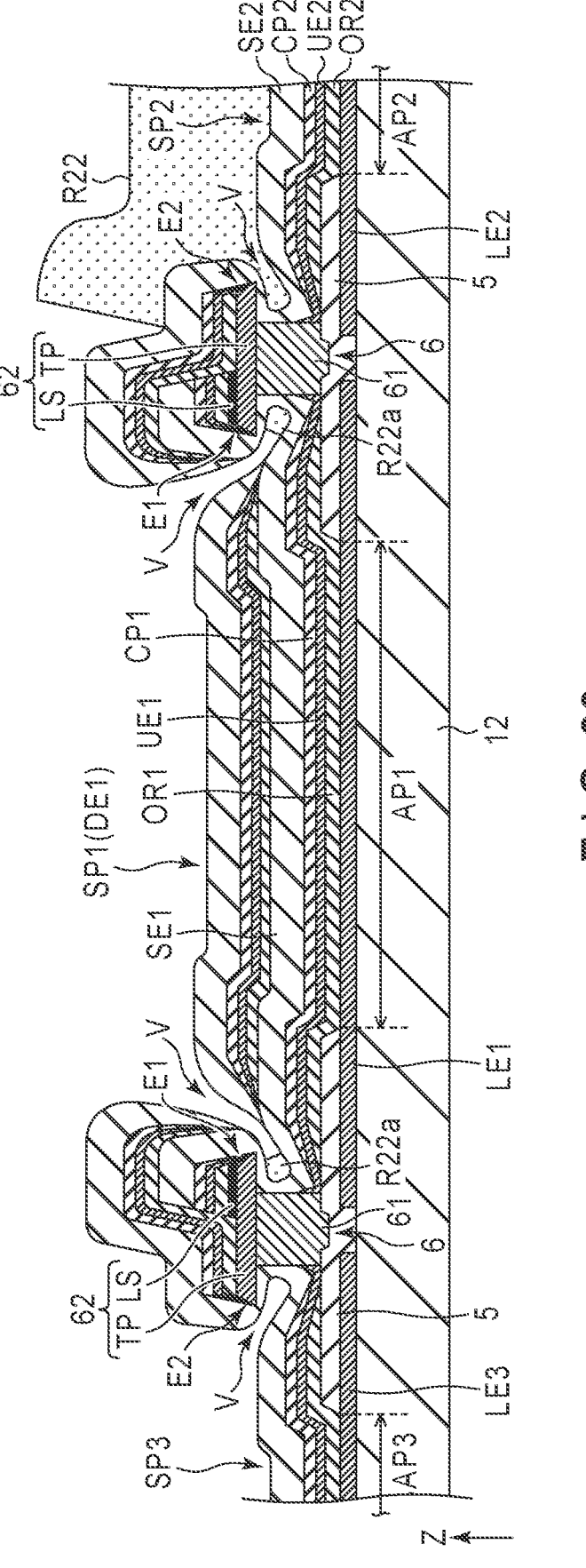
F I G. 23

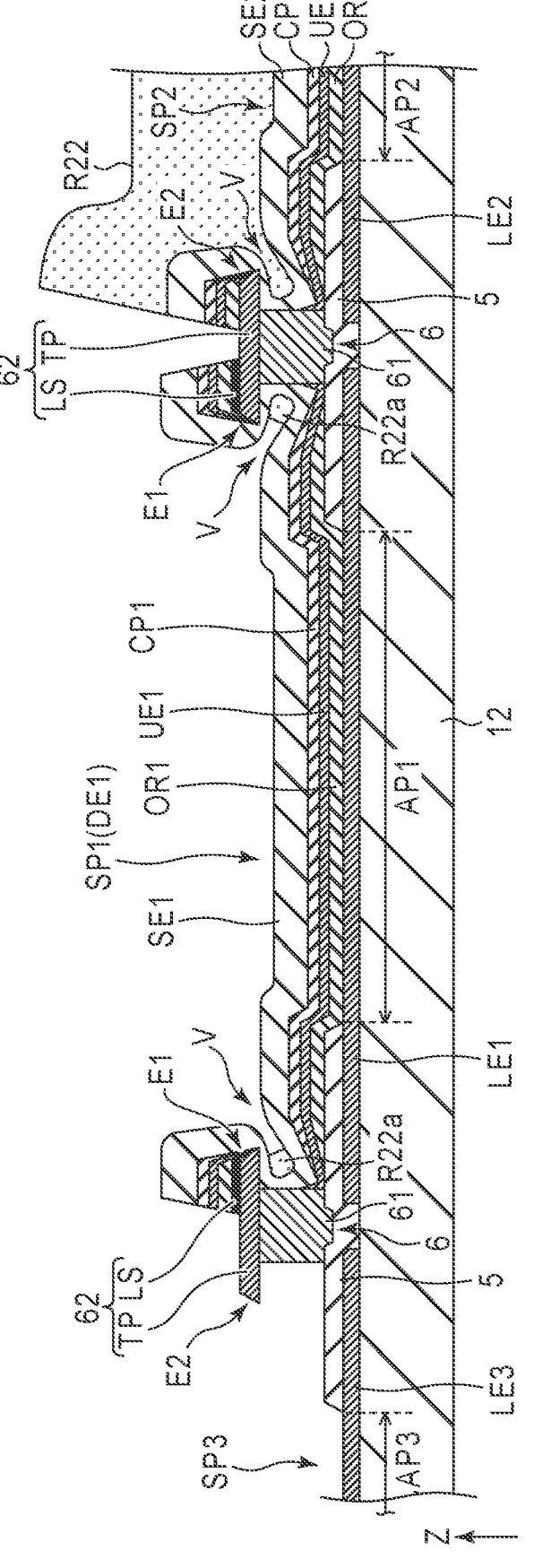
F I G. 24

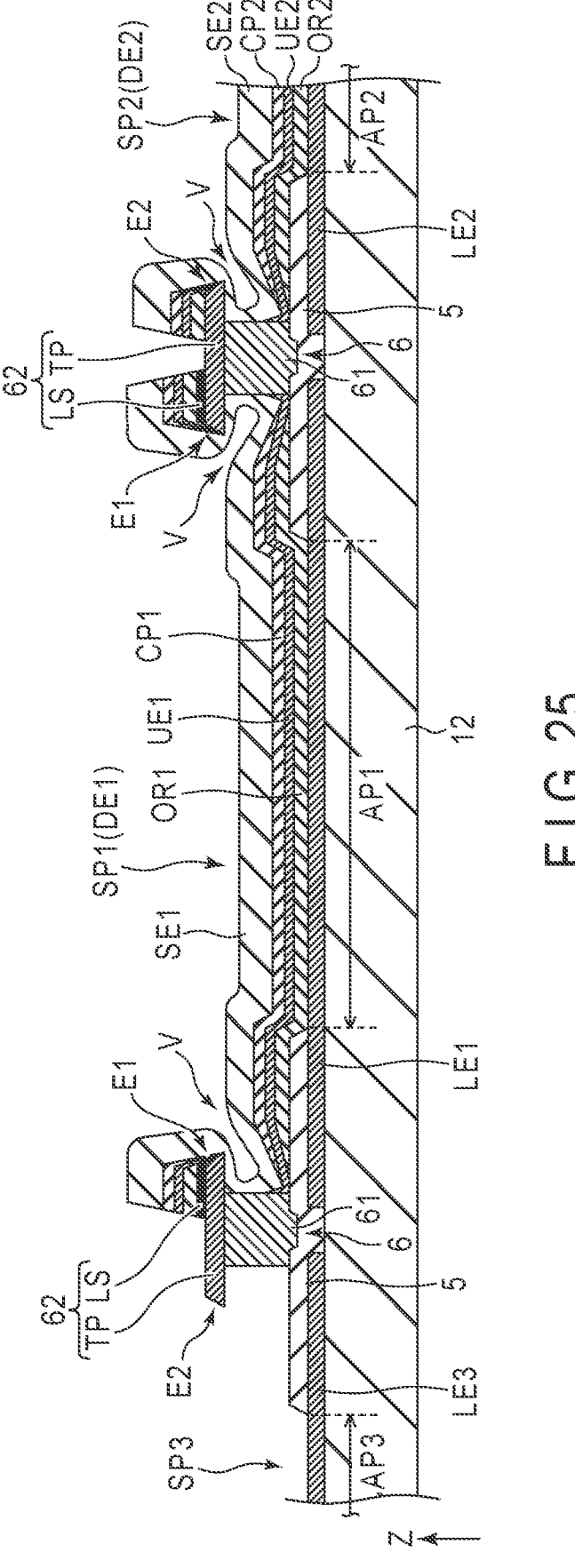
F I G. 25

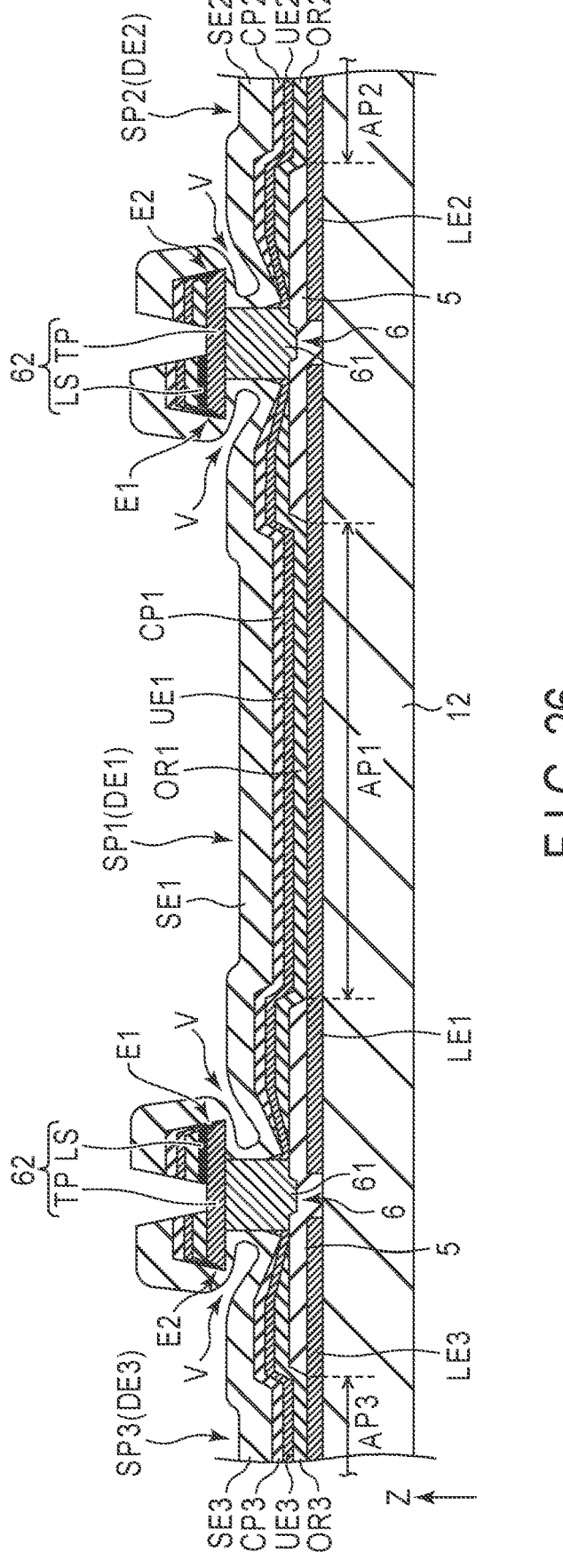
F I G. 26

DISPLAY DEVICE AND MANUFACTURING METHOD OF THE SAME

CROSS-REFERENCE TO RELATED APPLICATIONS

This application is based upon and claims the benefit of priority from Japanese Patent Application No. 2022-047128, filed Mar. 23, 2022, the entire contents of which are incorporated herein by reference.

FIELD

Embodiments described herein relate generally to a display device and a manufacturing method of the same.

BACKGROUND

Recently, display devices with organic light-emitting diodes (OLEDs) applied thereto as display elements have been put into practical use. This display device comprises a lower electrode, an organic layer covering the lower electrode, and an upper electrode covering the organic layer.

A technique of suppressing reduction in reliability is required in processes of manufacturing the above display device.

BRIEF DESCRIPTION OF THE DRAWINGS

FIG. 2 is a view showing an example of a layout of sub-pixels.

FIG. 3 is a schematic cross-sectional view showing the display device taken along line III-III in FIG. 2.

FIG. 7 is a flowchart showing an example of a method of manufacturing the display device.

FIG. 11 is a schematic cross-sectional view showing a manufacturing process following FIG. 10.

FIG. 12 is a schematic cross-sectional view showing a manufacturing process following FIG. 11.

FIG. 13 is a schematic cross-sectional view showing a manufacturing process following FIG. 12.

FIG. 14 is a schematic cross-sectional view showing a manufacturing process following FIG. 13.

FIG. 15 is a schematic cross-sectional view showing a manufacturing process following FIG. 14.

FIG. 16 is a schematic cross-sectional view showing a manufacturing process following FIG. 15.

FIG. 17 is a schematic cross-sectional view showing a manufacturing process following FIG. 16.

FIG. 18 is a schematic cross-sectional view showing a manufacturing process following FIG. 17.

FIG. 19 is a schematic cross-sectional view showing a manufacturing process following FIG. 18.

FIG. 20 is a schematic cross-sectional view showing a manufacturing process following FIG. 19.

FIG. 22 is a schematic cross-sectional view showing a manufacturing process following FIG. 21.

FIG. 23 is a schematic cross-sectional view showing a manufacturing process following FIG. 22.

FIG. 24 is a schematic cross-sectional view showing a manufacturing process following FIG. 23.

FIG. 25 is a schematic cross-sectional view showing a manufacturing process following FIG. 24.

FIG. 26 is a schematic cross-sectional view showing a manufacturing process following FIG. 25.

DETAILED DESCRIPTION

Figure 1:
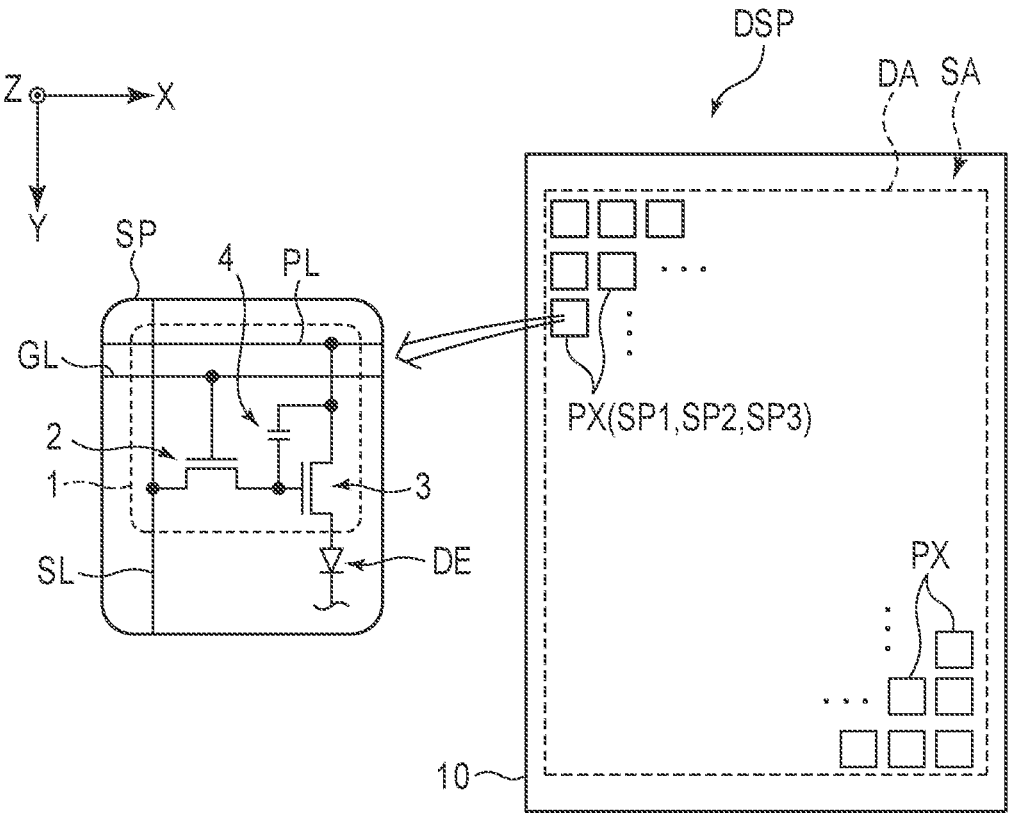
FIG. 1 is a view showing a configuration example of a display device according to one of embodiments.

In general, according to one embodiment, a display device comprises: a first display element including a first lower electrode, a first upper electrode, and a first organic layer emitting light in accordance with a voltage between the first lower electrode and the first upper electrode; a second display element including a second lower electrode, a second upper electrode, and a second organic layer emitting light in accordance with a voltage between the second lower electrode and the second upper electrode; and a partition arranged between the first display element and the second display element. The partition comprises: a lower portion including a first side surface on the first display element side and a second side surface on the second display element side; and an upper portion including a first end portion protruding from the first side surface and a second end portion protruding from the second side surface. The first end portion has a light-shielding property. The second end portion has translucency.

According to another aspect of the embodiment, a method of manufacturing a display device, comprises: forming a first lower electrode and a second lower electrode; forming a partition comprising a lower portion including a first side surface on the first lower electrode side and a second side surface on the second lower electrode side, and an upper portion including a first end portion with a light-shielding property protruding from the first side surface and a second end portion with translucency protruding from the second side surface; forming a first organic layer including a light emitting layer, a first upper electrode covering the first organic layer, a first sealing layer formed of an inorganic material, and a first resist covering the first sealing layer in order above the first lower electrode, the second lower electrode, and the partition; exposing a portion of the first resist, which overlaps with the second lower electrode and the second end portion; removing the exposed portion of the first resist by exposing the first resist to a developer; and forming a first display element including the first lower electrode, the first organic layer, and the first upper electrode by removing portions of the first organic layer, the first upper electrode, and the first sealing layer, which are exposed from the first resist, by first etching.

According to configurations of the embodiments, reliability of the display device can be improved.

One of embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction X, a direction along the Y-axis is referred to as a second direction Y, and a direction along the Z-axis is referred to as a third direction Z. Viewing various elements parallel to the third direction Z is referred to as planar view.

The display device of this embodiment is an organic electroluminescent display device comprising an organic light emitting diode (OLED) as a display element, and can be mounted on televisions, personal computers, vehicle-mounted devices, tablet terminals, smartphones, mobile phones, and the like.

FIG. 1 is a view showing a configuration example of a display device DSP according to the embodiment. The display device DSP has a display area DA where images are displayed and a surrounding area SA around the display area DA, on an insulating substrate 10. The substrate 10 may be glass or a flexible resin film.

In the embodiment, the shape of the substrate in planar view is a rectangular shape. However, the shape of the substrate 10 in planar view is not limited to a rectangular shape, but may be any other shape such as a square, a circle or an ellipse.

The display area DA includes a plurality of pixels PX arrayed in a matrix in the first direction X and the second direction Y. Each of the pixels PX includes a plurality of sub-pixels SP. As an example, the pixel PX includes a first sub-pixel SP1 of a blue color, a second sub-pixel SP2 of a green color, and a third sub-pixel SP3 of a red color. The pixel PX may include sub-pixels SP of other colors such as a white color together with the sub-pixels SP1, SP2, and SP3 or instead of any of the sub-pixels SP1, SP2, and SP3.

The sub-pixel SP comprises a pixel circuit 1 and a display element DE driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to the display element DE. The display element DE is an organic light-emitting diode (OLED) serving as a light emitting element.

The configuration of the pixel circuit 1 is not limited to the example shown in the figure. For example, the pixel circuit 1 may comprise more thin-film transistors and capacitors.

FIG. 2 is a view showing an example of a layout of the sub-pixels SP1, SP2, and SP3. In the example of FIG. 2, the second sub-pixel SP2 and the first sub-pixel SP1 are arranged in the first direction X. The third sub-pixel SP3 and the first sub-pixel SP1 are also arranged in the first direction X. Furthermore, the third sub-pixel SP3 and the second sub-pixel SP2 are arranged in the second direction Y.

When the sub-pixels SP1, SP2, and SP3 are arranged in such a layout, a row in which a plurality of first sub-pixels SP1 are repeatedly arranged in the second direction Y and a row in which the second sub-pixels SP2 and the third sub-pixel SP3 are alternately arranged in the second direction Y are formed in the display area DA. These rows are alternately arranged in the first direction X.

The layout of the sub-pixels SP1, SP2, and SP3 is not limited to the example in FIG. 2. As another example, the sub-pixels SP1, SP2, and SP3 in each pixel PX may be arranged in order in the first direction X.

A rib 5 and a partition 6 are arranged in the display area DA. The rib 5 includes a first pixel aperture AP1 in the first sub-pixel SP1, a second pixel aperture AP2 in the second sub-pixel SP2, and a third pixel aperture AP3 in the third sub-pixel SP3. In the example shown in FIG. 2, the second pixel aperture AP2 is larger than the third pixel aperture AP3, and the first pixel aperture AP1 is larger than the second pixel aperture AP2.

The partition 6 is arranged at a boundary between adjacent sub-pixels SP and overlaps with the rib 5 in planar view. The partition 6 includes a plurality of first partitions 6x extending in the first direction X and a plurality of second partitions 6y extending in the second direction Y. The plurality of first partitions 6x are arranged between two first pixel apertures AP1 adjacent in the second direction Y and between the pixel apertures AP2 and AP3 adjacent in the second direction Y. The second partitions 6y are arranged between the pixel apertures AP1 and AP2 adjacent in the first direction X and between the pixel apertures AP1 and AP3 adjacent in the first direction X.

In the example in FIG. 2, the first partitions 6x and the second partitions 6y are connected to each other. Thus, the partition 6 has a grating pattern surrounding the pixel apertures AP1, AP2, and AP3 as a whole. The partition 6 is considered to include apertures in the sub-pixels SP1, SP2, and SP3, similarly to the rib 5.

The first sub-pixel SP1 comprises a first first lower electrode LE1, a first upper electrode UE1, and a first organic layer OR1 each overlapping with the first pixel aperture AP1. The second sub-pixel SP2 comprises a second lower electrode LE2, a second upper electrode UE2, and a second organic layer OR2 each overlapping with the second pixel aperture AP2. The third sub-pixel SP3 comprises a third lower electrode LE3, a third upper electrode UE3, and a third organic layer OR3 each overlapping with the third pixel aperture AP3. In the example shown in FIG. 2, outer shapes of the first upper electrode UE1 and the first organic layer OR1 correspond to each other, outer shapes of the second upper electrode UE2 and the second organic layer OR2 correspond to each other, and outer shapes of the third upper electrode UE3 and the third organic layer OR3 correspond to each other.

The first lower electrode LE1, the first upper electrode UE1, and the first organic layer OR1 constitute a first display element DE1 of the first sub-pixel SP1. The second lower electrode LE2, the second upper electrode UE2, and the second organic layer OR2 constitute a second display element DE2 of the second sub-pixel SP2. The third lower electrode LE3, the third upper electrode UE3, and the third organic layer OR3 constitute a third display element DE3 of the third sub-pixel SP3.

For example, the first display element DE1 emits light of a blue color wavelength range, the second display element DE2 emits light of a green wavelength range, and the third display element DE3 emits light of a red color wavelength range.

The first lower electrode LE1 is connected to the pixel circuit 1 (see FIG. 1) of the first sub-pixel SP1 through a first contact hole CH1. The second lower electrode LE2 is connected to the pixel circuit 1 of the second sub-pixel SP2 through a second contact hole CH2. The third lower electrode LE3 is connected to the pixel circuit 1 of the third sub-pixel SP3 through a third contact hole CH3.

In the example shown in FIG. 2, the first contact hole CH1 entirely overlaps with the first partition 6x between two first pixel apertures AP1 adjacent to each other in the second direction Y. The contact holes CH2 and CH3 entirely overlap with the first partition 6x between the pixel apertures AP2 and AP3 adjacent to each other in the second direction Y. As another example, at least parts of the contact holes CH1, CH2, and CH3 may not overlap with the first partition 6x.

FIG. 3 is a schematic cross-sectional view showing the display device DSP taken along line III-III in FIG. 2. A circuit layer 11 is arranged on the above-described substrate 10. The circuit layer 11 includes various circuits and lines such as the pixel circuits 1, the scanning lines GL, the signal lines SL and the power lines PL shown in FIG. 1. The circuit layer 11 is covered with an organic insulating layer 12. The organic insulating layer 12 functions as a planarization film for planarizing uneven parts generated by the circuit layer 11. Although not shown in the cross section of FIG. 3, the above-described contact holes CH1, CH2, and CH3 are provided in the organic insulating layer 12.

The lower electrodes LE1, LE2, and LE3 are arranged on the organic insulating layer 12. The rib 5 is arranged on the insulating layer 12 and the lower electrodes LE1, LE2, and LE3. End parts of the lower electrodes LE1, LE2, and LE3 are covered with the rib 5.

The partition 6 includes a lower portion 61 which is arranged on the rib 5 and is conductive and an upper portion 62 which is arranged on the lower portion 61. The upper portion 62 has a width greater than the lower portion 61. As a result, both end parts of the upper portion 62 further protrude than side surfaces of the lower portion 61 in FIG. 3. The shape of the partition 6 may also be referred to as an overhanging shape.

The upper portion 62 includes a transparent layer TP having translucency and a light-shielding layer LS having a light shielding property. In the example shown in FIG. 3, the transparent layer TP is arranged on the lower portion 61, and the light-shielding layer LS is arranged on the transparent layer TP.

The light-shielding layer LS covers a part of the transparent layer TP, which is close to the first sub-pixel SP1, at the partition 6 between the sub-pixels SP1 and SP2. The light-shielding layer LS covers a part of the transparent layer TP, which is close to the first sub-pixel SP1, at the partition 6 between the sub-pixels SP1 and SP3.

The first organic layer OR1 covers the first lower electrode LE1 through the first pixel aperture AP1. The first upper electrode UE1 covers the first organic layer OR1 and is opposed to the first lower electrode LE1. The second organic layer OR2 covers the second lower electrode LE2 through the second pixel aperture AP2. The second upper electrode UE2 covers the second organic layer OR2 and is opposed to the second lower electrode LE2. The third organic layer OR3 covers the third lower electrode LE3 through the third pixel aperture AP3. The third upper electrode UE3 covers the third organic layer OR3 and is opposed to the third lower electrode LE3.

In the example shown in FIG. 3, a first cap layer CP1 is arranged on the first upper electrode UE1, a second cap layer CP2 is arranged on the second upper electrode UE2, and a third cap layer CP3 is arranged on the third upper electrode UE3. The cap layers CP1, CP2, and CP3 adjust optical properties of the light emitted from the organic layers OR1, OR2, and OR3, respectively.

Parts of the first organic layer OR1, the first upper electrode UE1, and the first cap layer CP1 are located on the upper portion 62. These parts are separated from the other parts of the first organic layer OR1, the first upper electrode UE1, and the first cap layer CP1. Similarly, parts of the second organic layer OR2, the second upper electrode UE2, and the second cap layer CP2 are located on the upper portion 62, and these parts are separated from the other parts of the second organic layer OR2, the second upper electrode UE2, and the second cap layer CP2. Furthermore, parts of the third organic layer OR3, the third upper electrode UE3, and the third cap layer CP3 are located on the upper portion 62, and these parts are separated from the other parts of the third organic layer OR3, the third upper electrode UE3, and the third cap layer CP3.

A first sealing layer SE1 is arranged at the first sub-pixel SP1, a second sealing layer SE2 is arranged at the second sub-pixel SP2, and a third sealing layer SE3 is arranged at the third sub-pixel SP3. The first sealing layer SE1 continuously covers the first cap layer CP1 and the partition 6. The second sealing layer SE2 continuously covers the second cap layer CP2 and the partition 6. The third sealing layer SE3 continuously covers the third cap layer CP3 and the partition 6.

The sealing layers SE1, SE2, and SE3 are covered with a resin layer 13. The resin layer 13 is covered with a sealing layer 14. Furthermore, the sealing layer 14 is covered with a resin layer 15.

The organic insulating layer 12 and the resin layers 13 and 15 are formed of an organic material. The rib 5 and the sealing layers 14, SE1, SE2, and SE3 are formed of, for example, an inorganic material such as silicon nitride (SiNx). The rib 5 and the sealing layers 14, SE1, SE2, and SE3 may be formed as a single-layer body of any one of silicon oxide (SiOx), silicon oxynitride (SiON) and aluminum oxide ($Al_2O_3$). Alternatively, the rib 5 and the sealing layers 14, SE1, SE2, and SE3 may be formed as a stacked-layer body formed of combination of at least two of a silicon nitride layer, a silicon oxide layer, a silicon oxynitride layer, and an aluminum oxide layer.

The upper electrodes UE1, UE2, and UE3 are formed of, for example, a metallic material such as an alloy (MgAg) of magnesium and silver. For example, the lower electrodes LE1, LE2, and LE3 correspond to anodes, and the upper electrodes UE1, UE2, and UE3 correspond to cathodes.

The organic layers OR1, OR2, and OR3 include a pair of functional layers and a light emitting layer interposed between these functional layers. As an example, each of the organic layers OR1, OR2, and OR3 includes a structure in which a hole-injection layer, a hole-transport layer, an electron blocking layer, a light emitting layer, a hole blocking layer, an electron-transport layer, and an electron-injection layer are stacked in order.

The cap layers CP1, CP2, and CP3 are formed of, for example, multilayer bodies of a plurality of transparent thin films. The multilayer body may include thin films formed of an inorganic material and thin films formed of an organic material, as the plurality of thin films. In addition, the plurality of thin films have refractive indices different from each other. The materials of the thin films constituting the multilayer body are different from the materials of the upper electrodes UE1, UE2, and UE3 and different from the materials of the sealing layers SE1, SE2, and SE3. The cap layers CP1, CP2, and CP3 may be omitted.

A common voltage is supplied to the partition 6. This common voltage is supplied to each of the upper electrodes UE1, UE2, and UE3 that are in contact with the side surfaces of the lower portion 61. A pixel voltage is supplied to the lower electrodes LE1, LE2, and LE3 through the pixel circuits 1 which are included in the respective sub-pixels SP1, SP2, and SP3.

When a potential difference is formed between the first lower electrode LE1 and the first upper electrode UE1, the light emitting layer of the first organic layer OR1 emits light of the blue wavelength range. When a potential difference is formed between the second lower electrode LE2 and the second upper electrode UE2, the light emitting layer of the second organic layer OR2 emits light of the green wavelength range. When a potential difference is formed between the third lower electrode LE3 and the third upper electrode UE3, the light emitting layer of the third organic layer OR3 emits light of the red wavelength range.

Figures 4, 5:
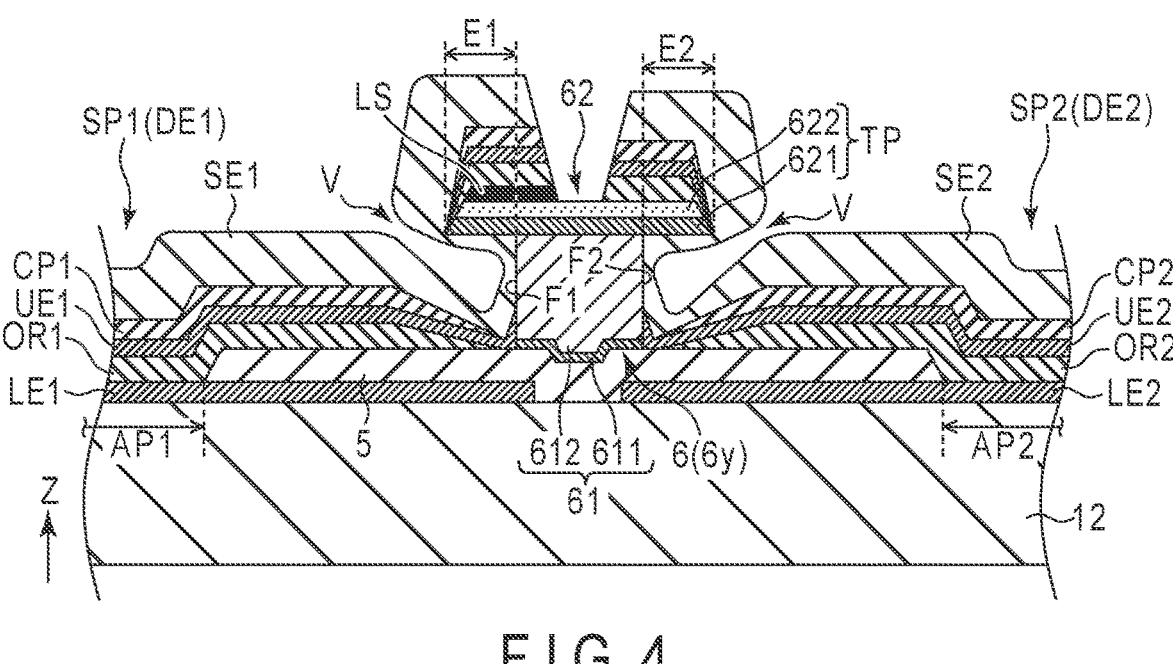
FIG. 4 is an expanded sectional view schematically showing a partition interposed between first and second sub-pixels and a vicinity of the partition.
FIG. 5 is a schematic cross-sectional view showing another example of the structure that can be applied to the partition.

FIG. 4 is an expanded cross-sectional view schematically showing the partition 6 arranged between the sub-pixels SP1 and SP2 and a vicinity of the partition 6. In this figure, the substrate 10, the circuit layer 11, the resin layer 13, the sealing layer 14, and the resin layer 15 are omitted.

The lower portion 61 of the partition 6 includes a first side surface F1 on the first sub-pixel SP1 side (first display element DE1 side) and a second side surface F2 on the second sub-pixel SP2 side (second display element DE2 side). The upper portion 62 of the partition 6 includes a first end portion E1 protruding from the first side surface F1 and a second end portion E2 protruding from the second side surface F2. The first upper electrode UE1 is in contact with the first side surface F1, and the second upper electrode UE2 is in contact with the second side surface F2.

In the example shown in FIG. 4, the lower portion 61 includes a first metal layer 611 arranged on the rib 5 and a second metal layer 612 arranged on the first metal layer 611. The second metal layer 612 is formed to be thicker than the first metal layer 611.

The transparent layer TP of the upper portion 62 is formed in a range from the first end portion E1 to the second end portion E2. In the example shown in FIG. 4, the transparent layer TP includes a first transparent layer 621 arranged on the first metal layer 611, and a second transparent layer 622 arranged on the first transparent layer 621.

The light-shielding layer LS of the upper portion 62 is arranged on at least the second transparent layer 622 at the first end portion E1, and is not arranged at the second end portion E2. In other words, the first end portion E1 includes the transparent layer TP and the light-shielding layer LS. In contrast, the second end portion E2 includes the transparent layer TP, but does not include the light-shielding layer LS. In the example shown in FIG. 4, the light-shielding layer LS also extends to an area between the first end portion E1 and the second end portion E2.

The light-shielding layer LS does not need to be arranged on the transparent layer TP. As another example, the light-shielding layer LS may be arranged under the transparent layer TP. Alternatively, the light-shielding layer LS may be arranged between the first transparent layer 621 and the second transparent layer 622.

The first metal layer 611 is formed of, for example, molybdenum (Mo). The second metal layer 612 is formed of, for example, aluminum (Al). The second metal layer 612 may be formed of an aluminum alloy, or may have a multilayer structure of aluminum and an aluminum alloy.

The first transparent layer 621 is formed of, for example, a silicon oxide. The second transparent layer 622 is formed of, for example, a transparent conductive oxide such as indium tin oxide (ITO), indium zinc oxide (IZO), or indium gallium zinc oxide (IGZO).

The light-shielding layer LS is formed of, for example, titanium (Ti). Preferably, the light shielding layer LS has a transmittance of 10% or less for at least one of light having a wavelength of 436 nm (g-line) and light having a wavelength of 405 nm (h-line), preferably for both the light.

In the examples shown in FIG. 3 and FIG. 4, the first organic layer OR1, the first upper electrode UE1, and the first cap layer CP1 on the upper portion 62 are separated from the second organic layer OR2, the second upper electrode UE2, and the second cap layer CP2 on the upper portion 62.

The first sealing layer SE1 continuously covers the first display element DE1, the first side surface F1, and the first end portion E1. The second sealing layer SE2 continuously covers the second display element DE2, the second side surface F2, and the second end portion E2. The end portion of the first sealing layer SE1 and the end portion of the second sealing layer SE2 are located on the upper portion 62 and are separated from each other.

A void V, which is not filled with the first sealing layer SE1, is formed below the first end portion E1. A void V, which is not filled with the second sealing layer SE2, is also formed below the second end portion E2.

Parts of the first organic layer OR1, the first upper electrode UE1, the first cap layer CP1, and the first sealing layer SE1 are located on the light-shielding layer LS. In the example shown in FIG. 4, these parts are not in contact with the second transparent layer 622. As another example, these parts may be in contact with the second transparent layer 622.

FIG. 5 is a schematic cross-sectional view showing another example of the structure that can be applied to the partition 6. In the example shown in this figure, the lower portion 61 has a single-layer structure. In addition, the transparent layer TP also has a single-layer structure.

The lower portion 61 of the single-layer structure can be formed of, for example, aluminum or an aluminum alloy. The transparent layer TP of the single-layer structure can be formed of, for example, silicon oxide.

The structure of the partition 6 is not limited to the examples shown in FIG. 4 and FIG. 5. As another example, the lower portion 61 may have a multilayer structure and the transparent layer TP may have a single-layer structure. Alternatively, the lower portion 61 may have a single-layer structure and the transparent layer TP may have a multilayer structure.

The configuration of the partition 6 between the sub-pixels SP1 and SP3 and its vicinity is similar to the configuration of the partition 6 between the sub-pixels SP1 and SP2 and its vicinity shown in FIG. 4 or FIG. 5.

Figure 6:
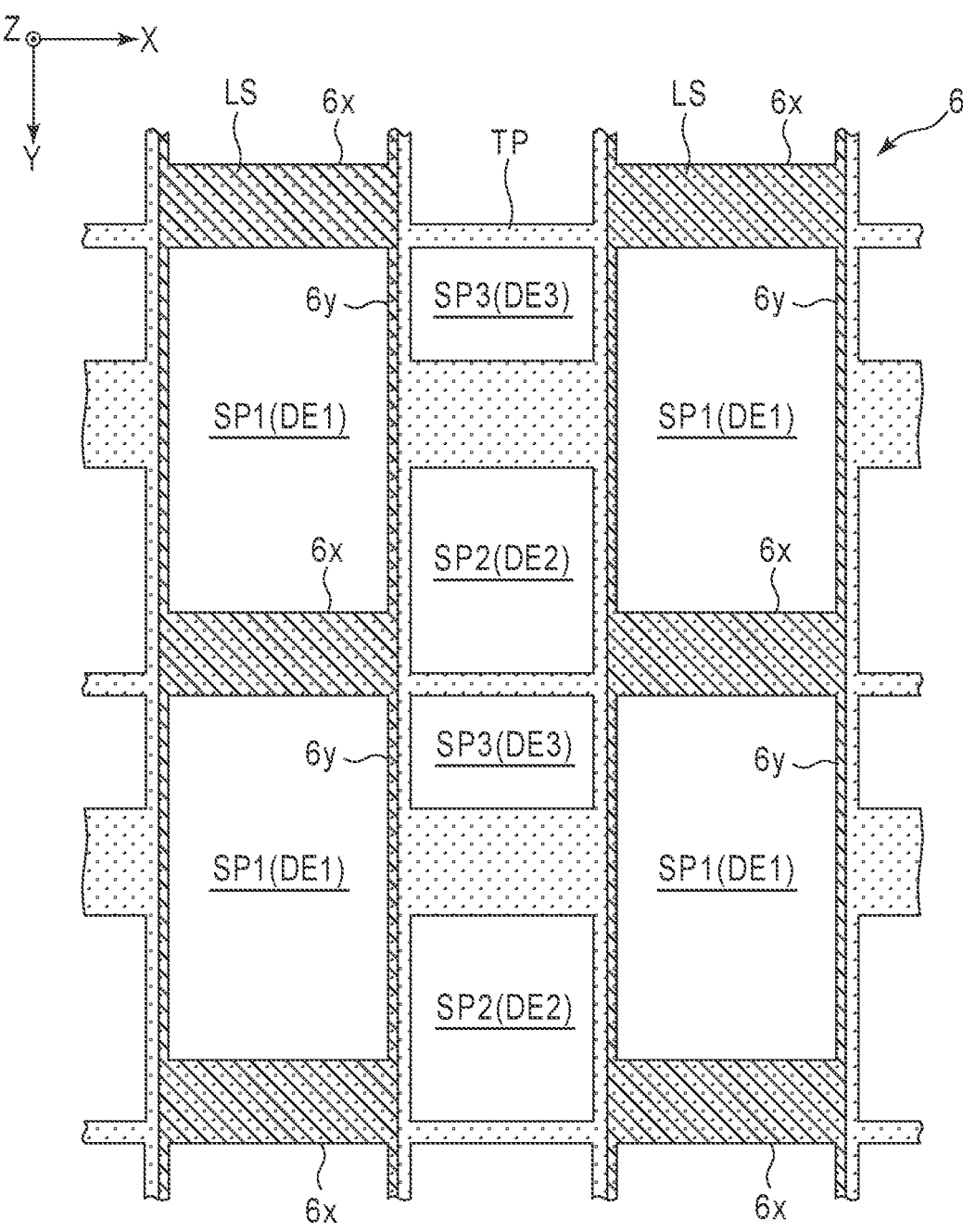
FIG. 6 is a schematic plan view showing the partition.

FIG. 6 is a schematic plan view showing the partition 6. An area with a dot pattern corresponds to the transparent layer TP, and an area a shaded pattern corresponds to the light-shielding layer LS. The light-shielding layer LS entirely overlaps with the transparent layer TP.

The transparent layer TP has a grid shape surrounding the sub-pixels SP1, SP2, and SP3 (display elements DE1, DE2, and DE3). The light-shielding layer LS surrounds the first sub-pixel SP1 (first display element DE1).

More specifically, the light-shielding layer LS is provided on an entire body of a first partition 6x between the first sub-pixels SP1 adjacent to each other in the second direction Y. Furthermore, the light-shielding layer LS is provided on a part of a second partition 6y between the sub-pixels SP1 and SP2, which is closer to the first sub-pixel SP1, and on a part of the second partition 6y between the sub-pixels SP1 and SP3, which is closer to the first sub-pixel SP1.

The shape of the light-shielding layer LS is not limited to the example shown in FIG. 6. For example, the light-shielding layer LS may have a frame shape surrounding each of the first sub-pixels SP1, and the light-shielding layers LS surrounding the adjacent first sub-pixels SP1 may be separated from each other.

Next, a method of manufacturing the display device DSP will be described.

FIG. 7 is a flowchart showing an example of the method of manufacturing the display device DSP. FIG. 8 to FIG. 26 are schematic cross-sectional views showing parts of the method of manufacturing the display device DSP.

In manufacturing the display device DSP, the circuit layer 11 and the organic insulating layer 12 are first formed on the substrate 10 (process P1 in FIG. 7).

Figure 8:
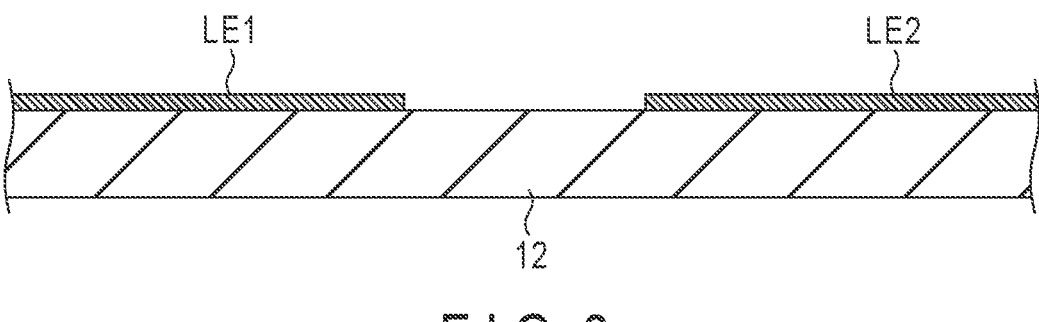
FIG. 8 is a schematic cross-sectional view showing a part of a manufacturing process of the display device.

After the process P1, the lower electrodes LE1, LE2, and LE3 are formed on the organic insulating layer 12 as shown in FIG. 8 (process P2 in FIG. 7).

Figure 9:
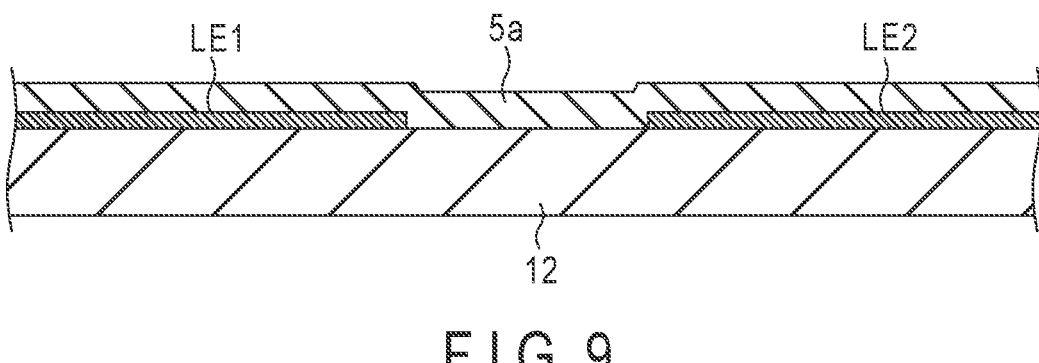
FIG. 9 is a schematic cross-sectional view showing a manufacturing process following FIG. 8.

After the process P2, an insulating layer 5a, which is to be a base of the rib 5, is formed as shown in FIG. 9 (process P3 in FIG. 7). The insulating layer 5a is formed of, for example, an inorganic material such as silicon nitride and covers the lower electrodes LE1, LE2, and LE3.

Figure 10:
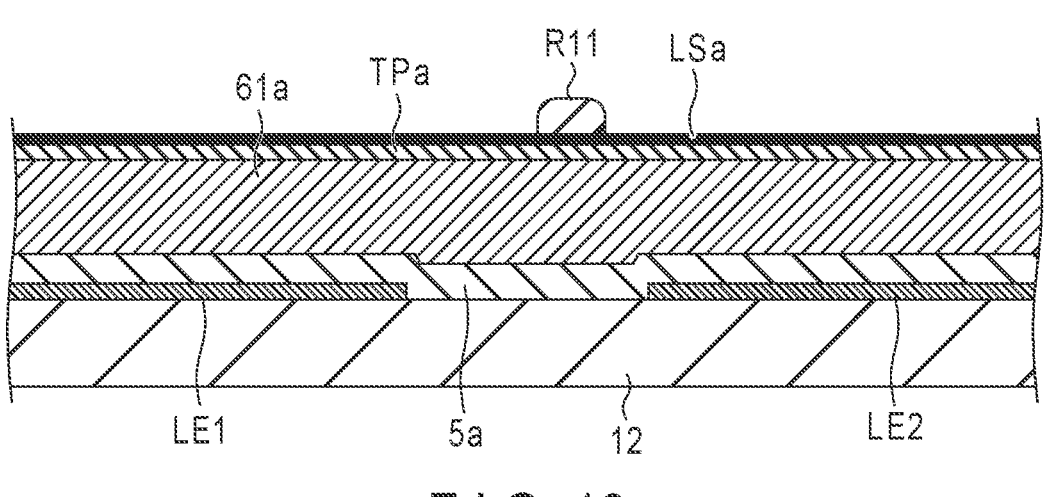
FIG. 10 is a schematic cross-sectional view showing a manufacturing process following FIG. 9.

After the process P3, the partition 6 is formed (process P4 in FIG. 7). More specifically, as shown in FIG. 10, first, a metal layer 61a, which is to be a base of the lower portion 61, is formed on the insulating layer 5a, a transparent layer TPa, which is to be a base of the transparent layer TP, is formed on the metal layer 61a, a light-shielding layer LSa, which is to be a base of the light-shielding layer LS, is formed on the transparent layer TPa, and a resist R11 is formed on the light-shielding layer LSa. The resist R11 is patterned in, for example, the shape of the light-shielding layer LS shown in FIG. 6.

When the lower portion 61 includes the first metal layer 611 and the second metal layer 612 as shown in FIG. 4, the metal layer 61a includes two layers formed of the materials of these metal layers 611 and 612. When the transparent layer TP includes the first transparent layer 621 and the second transparent layer 622 as shown in FIG. 4, the transparent layer TPa includes two layers formed of the materials of these transparent layers 621 and 622.

Next, as shown in FIG. 11, a portion of the light-shielding layer LSa, which is exposed from the resist R11, is removed by etching using the resist R11 as a mask. The light-shielding layer LS is thereby formed as shown in FIG. 11. After the formation of the light-shielding layer LS, the resist R11 is removed.

Next, as shown in FIG. 12, a resist R12 corresponding to the shape of the partition 6 is formed on the transparent layer TPa and the light-shielding layer LS. Furthermore, portions of the transparent layer TPa and the metal layer 61a, which are exposed from the resist R12, are removed by etching using the resist R12 as a mask. The upper portion 62 including the transparent layer TP and the light-shielding layer LS is thereby formed as shown in FIG. 13. In the example shown in FIG. 13, a part of the portion of the metal layer 61a, which is exposed from the resist R12, remains. As an example, the etching for the transparent layer TPa is wet etching and the etching for the metal layer 61a is anisotropic dry etching.

Next, isotropic wet etching is applied to the metal layer 61a. As an example, an etchant containing phosphoric acid, nitric acid, and acetic acid is used for the wet etching. The portion of the metal layer 61a, which is exposed from the resist R12, is removed by the wet etching to form the lower portion 61 as shown in FIG. 14. In the wet etching, the side surface of the lower portion 61 is also eroded. For this reason, the width of the lower portion 61 becomes smaller than that of the upper portion 62, and an overhanging partition 6 can be obtained. After the wet etching, the resist R12 is removed.

After the formation of the partition 6, the insulating layer 5a is patterned as shown in FIG. 15, and the pixel apertures AP1, AP2, and AP3 are formed (process P5 in FIG. 7). Thus, the lower electrodes LE1, LE2, and LE3 can be protected from etching during the formation of the partition 6 by forming the pixel apertures AP1, AP2, and AP3 after the formation of the partition 6.

After the process P5, as shown in FIG. 16, the first organic layer OR1 which is to be in contact with the first lower electrode LE1 through the first pixel aperture AP1, the first upper electrode UE1 which is to cover the first organic layer OR1, the first cap layer CP1 which is to cover the first upper electrode UE1, and the first sealing layer SE1 which is to cover the first cap layer CP1 are formed in order by vapor deposition (process P6 in FIG. 7). The first organic layer OR1, the first upper electrode UE1, the first cap layer CP1, and the first sealing layer SE1 are formed for at least the entire display area DA, and are arranged in not only the first sub-pixel SP1 but also the second sub-pixel SP2 and the third sub-pixel SP3.

After the process P6, the first display element DE1 is formed by patterning the first organic layer OR1, the first upper electrode UE1, the first cap layer CP1, and the first sealing layer SE1 (process P7 in FIG. 7).

More specifically, a positive type first resist R21 is first formed (applied) to cover the entire first sealing layer SE1, as shown in FIG. 17. The first resist R21 fills voids V which occur under the first end portion E1 and the second end portion E2 of each partition 6.

Next, the areas of the first resist R21, which excludes the first sub-pixel SP1 and the first end portion E1 of the partition 6 around the first sub-pixel SP1, such as an area overlapping with the lower electrodes LE2 and LE3 in the third direction Z and an area overlapping with the second end portion E2 of each partition 6 in the third direction Z, are exposed. Light EX1 used for this exposure includes, for example, at least one of light having a wavelength of 436 nm (g-line) and light having a wavelength of 405 nm (h-line). The transparent layer TP has a good translucency to these g and h lines. Therefore, light EX1 is also emitted to the first resist R21 that has entered the voids V under the second end portion E2.

After the exposure of the first resist R21, the first resist R21 is developed. In other words, a portion of the first resist R21, which is exposed to the light EX1, is removed as shown in FIG. 18, by exposing the first resist R21 to the developer. The first resist R21 that has entered the voids V under the second end portion E2 is also removed in this process.

After the development of the first resist R21, portions of the first organic layer OR1, the first upper electrode UE1, the first cap layer CP1, and the first sealing layer SE1, which are exposed from the first resist R21, are removed as shown in FIG. 19, by first etching using the first resist R21 as a mask. For example, the first etching includes dry etching of the first sealing layer SE1, wet etching or ashing of the first cap layer CP1, wet etching of the first upper electrode UE1, and ashing of the first organic layer OR1. In the dry etching of the first sealing layer SE1, the first cap layer CP1 and the first organic layer OR1 function as etching stoppers.

After that, as shown in FIG. 20, the first display element DE1 including the first organic layer OR1, the first upper electrode UE1, the first cap layer CP1, and the first sealing layer SE1 is completed by removing the first resist R21.

Figure 21:
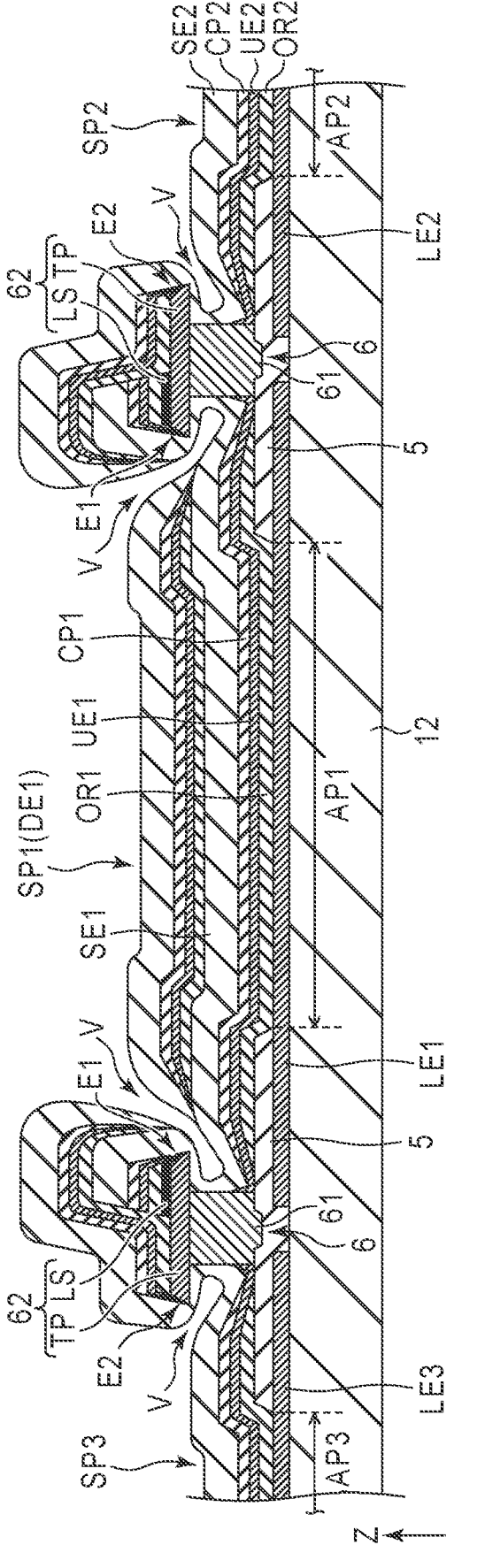
FIG. 21 is a schematic cross-sectional view showing a manufacturing process following FIG. 20.

After the process P7, as shown in FIG. 21, the second organic layer OR2 which is to be in contact with the second lower electrode LE2 through the second pixel aperture AP2, the second upper electrode UE2 which is to cover the second organic layer OR2, the second cap layer CP2 which is to cover the second upper electrode UE2, and the second sealing layer SE2 which is to cover the second cap layer CP2 are formed in order by vapor deposition (process P8 in FIG. 7). The second organic layer OR2, the second upper electrode UE2, the second cap layer CP2, and the second sealing layer SE2 are formed for at least the entire display area DA, and are arranged in not only the second sub-pixel SP2 but also the first sub-pixel SP1 and the third sub-pixel SP3.

In the example shown in FIG. 21, voids V, which are not filled with the sealing layers SE1 and SE2, and the like, are formed under the first end portion E1 and the second end portion E2 of each partition 6.

After the process P8, the second display element DE2 is formed by patterning the second organic layer OR2, the second upper electrode UE2, the second cap layer CP2, and the second sealing layer SE2 (process P9 in FIG. 7).

More specifically, a positive type second resist R22 is first formed (applied) to cover the entire second sealing layer SE2 and the like, as shown in FIG. 22. The second resist R22 fills the voids V under the first end portion E1 and the second end portion E2 of each partition 6.

Next, the areas of the second resist R22, which excludes the second sub-pixel SP2 and the second end portion E2 of the partition 6 around the second sub-pixel SP2, such as a portion overlapping with the first display element DE1 in the third direction Z, an area overlapping with the third lower electrode LE3 in the third direction Z, an area overlapping with the partition 6 between the sub-pixels SP1 and SP3 in the third direction Z, and an area overlapping with the first end portion E1 of the partition 6 between the sub-pixels SP1 and SP2 in the third direction Z, are exposed. Light EX2 used for this exposure includes, for example, at least one of the g-line and h-line, similarly to the above-described light EX1.

The light EX2 is also emitted to the second resist R22 that has entered the voids V located under the second end portion E2 of the partition 6 surrounding the third sub-pixel SP3. In contrast, the light EX2 is blocked by the light-shielding layer LS. For this reason, the light EX2 is hardly emitted to the second resist R22 that has entered the voids V located under the first end portion E1 including the light-shielding layer LS.

After the exposure of the second resist R22, the second resist R22 is developed. In other words, a portion of the second resist R22, which is exposed to the light EX2, is removed as shown in FIG. 23, by exposing the second resist R22 to the developer. The second resist R22 that has entered the voids V located under the second end portion E2 of the partition 6 surrounding the third sub-pixel SP3 is also removed in this process. In contrast, the second resist R22 that has entered the voids V located under the first end portion E1 of each partition 6 remains without being removed by the developer. The second resist R22 remaining in the voids V is hereinafter referred to as a remaining portion R22a.

After the development of the second resist R22, portions of the second organic layer OR2, the second upper electrode UE2, the second cap layer CP2, and the second sealing layer SE2, which are exposed from the second resist R22, are removed as shown in FIG. 24, by second etching using the second resist R22 as a mask. The remaining portion R22a also remains when the second etching is executed. For example, the second etching includes dry etching of the second sealing layer SE2, wet etching or ashing of the second cap layer CP2, wet etching of the second upper electrode UE2, and ashing of the second organic layer OR2. In the dry etching of the second sealing layer SE2, the second cap layer CP2 and the second organic layer OR2 function as etching stoppers.

After that, as shown in FIG. 25, the second display element DE2 including the second organic layer OR2, the second upper electrode UE2, the second cap layer CP2, and the second sealing layer SE2 is completed by removing the second resist R22 and the remaining portion R22a.

The third display element DE is also formed in the same procedure as the first display element DE1 and the second display element DE2. In other words, the third organic layer OR3 which is to be in contact with the third lower electrode LE3 through the third pixel aperture AP3, the third upper electrode UE3 which is to cover the third organic layer OR3, the third cap layer CP3 which is to cover the third upper electrode UE3, and the third sealing layer SE3 which is to cover the third cap layer CP3 are formed in order by vapor deposition (process P10 in FIG. 7).

Furthermore, the third display element DE3 including the third organic layer OR3, the third upper electrode UE3, the third cap layer CP3, and the third sealing layer SE3 is formed as shown in FIG. 26, by the same patterning as that of the processes P7 and P9 (process P11 in FIG. 7). This patterning process includes the formation of a positive type third resist that covers the entire third sealing layer SE3, exposure and development of the third resist, and third etching using the third resist as a mask. For example, light including g-line and h-line is used for the exposure of the third resist, similarly to the light EX1 and the light EX2. After the development of the third resist, a remaining portion of the third resist may be generated under the first end portion E1, similarly to the above-described remaining portion R22a.

After the display elements DE1, DE2, and DE3 are formed, the resin layer 13, the sealing layer 14, and the resin layer 15 shown in FIG. 3 are formed in order, and the display device DSP is completed (process P12 in FIG. 7).

In the present embodiment described above, the upper portion 62 of the partition 6 adjacent to the first sub-pixel SP1 has the light-shielding first end portion E1 and the translucent second end portion E2. In such a configuration, the reliability of the display device DSP can be improved in manufacturing the display device DSP by the manufacturing method illustrated in FIG. 7 through FIG. 26.

In other words, when the light EX1 is not sufficiently emitted to the first resist R21 that has entered the voids V under the second end portion E2 during the exposure of the first resist R21 shown in FIG. 17, the remaining portion of the first resist R21 is generated in the voids V even after the development of the first resist R21. If such a remaining portion is generated, the portions of the first sealing layer SE1, the first organic layer OR1, the first upper electrode UE1, and the first cap layer CP1, which are covered with the remaining portion, remain without being removed in the subsequent first etching, and the formation of the display elements DE2 and DE3 may be inhibited. For example, if areas where the upper electrodes UE2 and UE3 are not in contact with the lower portion 61 of the partition 6 are generated by the first sealing layer SE1 remaining without being removed, and the like, good conduction between the upper electrodes UE2 and UE3 and the lower portion 61 cannot be secured.

In contrast, if the second end portion E2 has a good transparency to the light EX1 similarly to the present embodiment, the light EX1 is emitted to the first resist R21 that has entered the voids V under the second end portion E2. For this reason, the generation of the remaining portion of the first resist R21 in the voids V can be suppressed. As a result, a highly reliable display device DSP comprising the well-shaped second display element DE2 and third display element DE3 can be manufactured.

In contrast, if the upper portion 62 has translucency as a whole, the light EX2 is also emitted to the second resist R22 that has entered the voids V under the first end portion E1 when the second resist R22 shown in FIG. 22 is exposed. In this case, the remaining portion R22a shown in FIG. 23 is not generated. In the vicinity of the voids V under the first end portion E1, the first sealing layer SE1 and the second sealing layer SE2 are thin, and the second cap layer CP2 and the second organic layer OR2, which serve as etching stoppers against dry etching of the second sealing layer SE2, are not sufficiently formed. For this reason, the first sealing layer SE1 and the first display element DE1 under the first end portion E1 may be damaged in the second etching and the third etching.

In contrast, when the first end portion E1 has a light-shielding property similarly to the present embodiment, the remaining portion R22a is generated in the voids V under the first end portion E1. The first sealing layer SE1 and the first display element DE1 under the first end portion E1 are protected from the second etching and the third etching by the remaining portion R22a. As a result, a highly reliable display device DSP comprising a well-shaped first display element DE1 can be manufactured.

All of the display devices and manufacturing methods that can be implemented by a person of ordinary skill in the art through arbitrary design changes to the display devices and manufacturing methods described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, the above embodiments with addition, deletion, and/or designed change of their structural elements by a person having ordinary skill in the art, or the above embodiments with addition, omission, and/or condition change of their processes by a person having ordinary skill in the art are encompassed by the scope of the present inventions without departing the spirit of the inventions.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device comprising:
a first display element including a first lower electrode, a first upper electrode, and a first organic layer emitting light in accordance with a voltage between the first lower electrode and the first upper electrode;
a second display element including a second lower electrode, a second upper electrode, and a second organic layer emitting light in accordance with a voltage between the second lower electrode and the second upper electrode; and
a partition arranged between the first display element and the second display element,
wherein
the partition comprises:
a lower portion including a first side surface on the first display element side and a second side surface on the second display element side; and
an upper portion including a first end portion protruding from the first side surface and a second end portion protruding from the second side surface,
the first end portion has a light-shielding property, and
the second end portion has translucency.

2. The display device of claim 1, wherein
the upper portion comprises:
a transparent layer extending from the first end portion to the second end portion; and
a light-shielding layer arranged at the first end portion.

3. The display device of claim 2, wherein
the light-shielding layer is arranged on the transparent layer.

4. The display device of claim 2, wherein
the light-shielding layer is formed of titanium.

5. The display device of claim 2, wherein
the light shielding layer has a transmittance of 10% or less for light having a wavelength of 436 nm or light having a wavelength of 405 nm.

6. The display device of claim 2, wherein
the partition surrounds the first display element and the second display element, and
the light-shielding layer surrounds the first display element.

7. The display device of claim 2, wherein
the transparent layer includes:
a first transparent layer formed of a silicon oxide; and
a second transparent layer formed of a conductive oxide.

8. The display device of claim 2, wherein
the transparent layer has a single-layer structure of a silicon oxide.

9. The display device of claim 1, wherein
the lower portion is conductive,
the first upper electrode is in contact with the first side surface, and
the second upper electrode is in contact with the second side surface.

10. The display device of claim 1, further comprising:
a first sealing layer formed of an inorganic material covering the first display element, the first side surface, and the first end portion; and
a second sealing layer formed of an inorganic material covering the second display element, the second side surface, and the second end portion,
wherein end portions of the respective first sealing layer and second sealing layer are located on the upper portion and are separated from each other.

\* \* \* \* \*